United States Patent
Bando

(10) Patent No.: US 9,315,335 B2
(45) Date of Patent: Apr. 19, 2016

(54) CONVEYANCE SYSTEM

(75) Inventor: Kenji Bando, Kobe (JP)

(73) Assignee: KAWASAKI JUKOGYO KABUSHIKI KAISHA, Kobe (JP)

( * ) Notice: Subject to any disclaimer, the term of this patent is extended or adjusted under 35 U.S.C. 154(b) by 16 days.

(21) Appl. No.: 14/348,693

(22) PCT Filed: Sep. 6, 2012

(86) PCT No.: PCT/JP2012/005654
§ 371 (c)(1),
(2), (4) Date: May 20, 2014

(87) PCT Pub. No.: WO2013/046552
PCT Pub. Date: Apr. 4, 2013

(65) Prior Publication Data
US 2014/0291122 A1    Oct. 2, 2014

(30) Foreign Application Priority Data
Sep. 29, 2011   (JP) .................................. 2011-214256

(51) Int. Cl.
*B65G 47/06* (2006.01)
*B65G 47/52* (2006.01)
(Continued)

(52) U.S. Cl.
CPC ................ *B65G 47/06* (2013.01); *B65G 47/52* (2013.01); *B65G 49/06* (2013.01); *B65G 49/064* (2013.01);
(Continued)

(58) Field of Classification Search
CPC ........ B65G 47/06; B65G 47/52; B65G 49/06; B65G 49/064; B65G 49/068; H01L 21/67706; H01L 21/67736; H01L 21/67778

USPC .................................... 198/540, 562, 602
See application file for complete search history.

(56) References Cited

U.S. PATENT DOCUMENTS 4,697,974 A * 10/1987 Eltoukhy ................. 414/331.09
4,900,212 A *  2/1990 Mikahara ................. 414/416.03
(Continued)

FOREIGN PATENT DOCUMENTS

| EP | 0 683 054 A2 | 11/1995 |
| EP | 1 282 156 A2 | 2/2003 |

(Continued)

OTHER PUBLICATIONS

International Search Report issued in International Application No. PCT/JP2012/005654 mailed Nov. 6, 2012.
(Continued)

*Primary Examiner* — Lesile A Nicholson, III
(74) *Attorney, Agent, or Firm* — Oliff PLC

(57) ABSTRACT

A conveyance system includes a storage case, a lifting/lowering apparatus, a handover apparatus, and a conveying apparatus. The lifting/lowering apparatus lifts and lowers the storage case to position each substrate stored in the storage case to a receiving position sequentially. The handover apparatus receives the substrate at the receiving position, and hand over the substrate to the conveying apparatus at a handover position. The conveying apparatus includes a pair of belts. The pair of belts is provided such that the belts are spaced apart from each other in a left-right direction. A plurality of profiles associated with each other are provided on the pair of belts, respectively. The profiles associated with each other are configured to move together in a conveying direction, support outer edges of the substrate handed over at the handover position, and position the substrate to a prescribed position.

7 Claims, 10 Drawing Sheets

(51) Int. Cl.
*B65G 49/06* (2006.01)
*H01L 21/677* (2006.01)

(52) U.S. Cl.
CPC ........ *B65G 49/068* (2013.01); *H01L 21/67706* (2013.01); *H01L 21/67736* (2013.01); *H01L 21/67778* (2013.01)

(56) References Cited

U.S. PATENT DOCUMENTS

| | | | | |
|---|---|---|---|---|
| 5,848,868 | A | * | 12/1998 | Suzuki et al. ............ 414/416.03 |
| 6,001,670 | A | * | 12/1999 | Mochida et al. ............. 438/111 |
| 6,109,323 | A | * | 8/2000 | Baccini .......................... 156/378 |
| 7,311,488 | B2 | * | 12/2007 | Park .............................. 414/663 |
| 2013/0011227 | A1 | * | 1/2013 | Pietsch .......................... 414/277 |

FOREIGN PATENT DOCUMENTS

| | | |
|---|---|---|
| JP | A-62-211911 | 9/1987 |
| JP | A-64-13340 | 1/1989 |
| JP | A-10-265022 | 10/1998 |
| JP | A-2006-44839 | 2/2006 |
| WO | 2010/009865 A1 | 1/2010 |

OTHER PUBLICATIONS

Mar. 17, 2015 Extended Supplementary European Search Report issued in European Application No. 12 83 5906.4.

* cited by examiner

CONVEYANCE SYSTEM

TECHNICAL FIELD

The present invention relates to conveyance systems for conveying substrates.

BACKGROUND ART

One of the known substrate-conveying apparatuses is, for example, a conveyor. One type of conveyor is disclosed in, for example, Patent Literature 1. The conveyor disclosed in Patent Literature 1 includes a conveying path, which is formed by arranging a plurality of rails with predetermined spacing therebetween. Motor-driven chains are provided at both sides of the conveying path, respectively. A movable unit is provided in a manner to span between the pair of chains. The movable unit is provided with a plurality of scrapers. The scrapers are arranged in a manner to protrude upward from gaps between the rails.

In the conveyor with the above-described configuration, when the chains are driven by a motor, the movable unit moves together with the chains. As a result, the scrapers of the movable unit move, and the scrapers push a conveyance object placed on the conveying path. In this manner, the conveyance object is conveyed.

CITATION LIST

Patent Literature

PTL 1: Japanese Laid-Open Patent Application Publication No. H10-265022

SUMMARY OF INVENTION

Technical Problem

In a case where a substrate stored in a storage case is to be conveyed, the substrate is taken out of the storage case and received, and then conveyed. However, the conveyor disclosed in Patent Literature 1 does not include a structure for receiving a substrate from a storage case. Moreover, the conveyor disclosed in Patent Literature 1 is configured such that the conveyance object is dropped and thereby placed onto the conveying path. For this reason, there is a risk of damaging the substrate. Furthermore, the conveyor disclosed in Patent Literature 1 is not capable of storing substrates in a storage case. Therefore, the conveyor disclosed in Patent Literature 1 cannot be adopted as a conveyance system for conveying substrates.

Meanwhile, after being conveyed, the substrate undergoes various processing. In the processing, precise positioning of the substrate is required. Since the conveyor disclosed in Patent Literature 1 is configured to convey a substrate on the conveying path by pushing the substrate with the scrapers, the positioning of the substrate cannot be performed. Therefore, a positioning device needs to be additionally installed, which results in an increase in the size of the system.

Therefore, an object of the present invention is to provide a conveyance system capable of receiving a substrate from a storage case, conveying the substrate, and performing positioning of the substrate.

Solution to Problem

A conveyance system according to the present invention includes: a storage case configured to store a plurality of substrates such that the stored substrates are vertically spaced apart from each other; a lifting/lowering apparatus configured to lift and lower the storage case to position each substrate stored in the storage case to a receiving position sequentially; a handover apparatus configured to receive the substrate at the receiving position, and hand over the substrate at a handover position; and a conveying apparatus configured to receive the substrate at the handover position, and convey the substrate. The conveying apparatus includes: a plurality of conveying belts each extending in a conveying direction and provided such that the conveying belts are arranged side by side and spaced apart from each other in a predetermined direction; a plurality of support members associated with each other and provided on the plurality of conveying belts, respectively; and a conveying unit configured to drive the plurality of conveying belts such that the plurality of support members associated with each other move together in the conveying direction. The support members, which are associated with each other and which are provided on the plurality of conveying belts, are configured to support outer edges of the substrate that has been handed over at the handover position, and position the supported substrate to a prescribed position.

According to the present invention, by lifting or lowering the storage case by means of the lifting/lowering apparatus and operating the handover apparatus, the substrates can be sequentially handed over from the storage case to the conveying apparatus. In addition, by merely handing over a substrate from the handover apparatus to the support members of the conveying apparatus, the substrate can be positioned to the prescribed position on the support members, and positioning of the substrate can be performed by moving the conveying belts by means of the conveying unit. Thus, the substrate can be received and conveyed from the storage case, and positioning of the substrate can be performed while the substrate is being conveyed.

In the above-described invention, preferably, the conveyance system includes a space-restricting mechanism configured to restrict space between a pair of conveying belts in the predetermined direction among the plurality of conveying belts. Preferably, the support members that are associated with each other and that are provided on the pair of conveying belts, respectively, include: support portions configured to support respective outer edges of the substrate at both sides of the substrate in the predetermined direction; and positioning portions configured to position respective side surfaces of the substrate in the predetermined direction, the positioning portions facing each other in the predetermined direction. Preferably, the support members are configured such that, in a state where the space-restricting mechanism is not narrowing down the space between the pair of conveying belts in the predetermined direction, the support members associated with each other and provided on the pair of conveying members support the outer edges of the substrate that has been handed over at the handover position, and when the space-restricting mechanism narrows down the space between the pair of conveying belts in the predetermined direction, the support members position the supported substrate to the prescribed position.

According to the above-described configuration, at the handover position, the space between the pair of conveying belts in the predetermined direction is widened, and thereby a pair of support members are distanced from each other in the predetermined direction. As a result, space between the positioning portions is widened, and an allowable range of deviation from proper substrate positioning when the substrate is handed over at the handover position can be made great, which allows the substrate to be readily placed onto the support members.

Meanwhile, at positions other than the handover position, the space between the pair of conveying belts in the predetermined direction is narrowed down by the space-restricting mechanism, and thereby the pair of support members come closer to each other in the predetermined direction. As a result, the space between the positioning portions is narrowed down, which makes it possible to perform more precise positioning of the substrate while conveying the substrate. Therefore, it is not necessary to perform a positioning operation by using another device in order to improve the precision of the positioning, and a conveyance stop time can be eliminated.

In the above-described invention, preferably, each support member is formed such that its portion supporting the substrate in such a manner as to guide the substrate to the prescribed position when the substrate is placed on the support member is tapered.

According to the above-described configuration, positioning of the substrate can be performed by merely placing the substrate onto the support members.

In the above-described invention, preferably, the handover apparatus includes: a placing stand on which the substrate is to be placed; a moving unit configured to move the placing stand between the receiving position and the handover position; and a lifting/lowering cam mechanism configured to lift and lower the placing stand in conjunction with movement of the placing stand. Preferably, the lifting/lowering cam mechanism is configured to: when the placing stand is moved to the receiving position, lift the placing stand to receive the substrate on the placing stand; and when the placing stand is moved to the handover position, lower the placing stand to hand over the substrate to the plurality of support members.

According to the above-described configuration, by moving the placing stand in the conveying direction by the moving unit, the placing stand can be lifted and lowered by the lifting/lowering cam mechanism so that the substrate can be placed onto the placing stand at the receiving position and the substrate on the placing stand can be handed over to the conveying apparatus at the handover position. In this manner, a driving apparatus for moving the placing stand can serve as a driving apparatus for lifting and lowering the placing stand. This makes it possible to reduce the number of components.

In the above-described invention, preferably, the conveyance system includes: a transfer apparatus provided at a middle position between the receiving position and the handover position and configured to transfer, when the substrate is at the middle position, the substrate in a direction different from the conveying direction in accordance with a condition of the substrate; and a controller configured to control operations of the conveying unit and the transfer apparatus. Preferably, the placing stand includes a first area and a second area, on each of which the substrate is to be placed. Preferably, the first area is configured such that, when the placing stand is moved to the receiving position, the first area receives the substrate at the receiving position, and when the placing stand is moved to the handover position, the first area positions the substrate that is placed on the first area to the middle position. Preferably, the second area is configured such that, when the placing stand is moved to the receiving position, the second area receives the substrate that is positioned at the middle position, and when the placing stand is moved to the handover position, the second area hands over the substrate that is placed on the second area to the plurality of support members, which are associated with each other. Preferably, multiple sets of the plurality of support members associated with each other are installed on the conveying belts and arranged in the conveying direction. Preferably, the controller is configured to: cause the conveying unit to move the conveying belts forward by a length of the substrate in the conveying direction after the handover apparatus is positioned to the handover position; and refrain from causing the conveying unit to move the conveying belts forward after the handover apparatus is positioned to the handover position if the substrate has been transferred by the transfer apparatus.

The above-described configuration allows the conveying apparatus to convey a plurality of substrates at the same time. According to the above-described configuration, if a substrate has been transferred by the transfer apparatus, the conveying belts are not moved forward. Therefore, in the conveying apparatus, a plurality of substrates can be densely arranged in the conveying direction. That is, a situation where placement of a substrate is partially missing from the arrangement of the substrates can be prevented.

A conveyance system according to the present invention includes: a conveying apparatus configured to convey a received substrate to the receiving position; a handover apparatus configured to receive the substrate at the receiving position from the conveying apparatus, and hand over the substrate at a handover position; a storage case including storage spaces each storing the substrate handed over by the handover apparatus, the storage spaces being positioned such that the storage spaces are vertically spaced apart from each other; and a lifting/lowering apparatus configured to lift and lower the storage case to position each storage space of the storage case to the receiving position sequentially. The conveying apparatus includes: a plurality of conveying belts each extending in a conveying direction and provided such that the conveying belts are arranged side by side and spaced apart from each other in a predetermined direction; a plurality of support members associated with each other and provided on the plurality of conveying belts, respectively; and a conveying unit configured to drive the plurality of conveying belts such that the plurality of support members associated with each other move together in the conveying direction. The support members, which are associated with each other and which are provided on the plurality of conveying belts, are configured to support outer edges of the received substrate, and position the supported substrate to a prescribed position.

According to the above-described configuration, the substrate can be positioned to the prescribed position on the support members by merely handing over the substrate to the support members of the conveying apparatus, and the substrate thus positioned can be conveyed by moving the conveying belts by means of the conveying unit. By operating the handover apparatus to lift or lower the storage case, substrates can be stored into the storage case sequentially. In this manner, the substrates can be properly and readily stored into the storage case.

Advantageous Effects of Invention

According to the present invention, the substrates can be received and conveyed from the storage case, and positioning of the substrates can be performed.

The above object, other objects, features, and advantages of the present invention will be made clear by the following detailed description of preferred embodiments with reference to the accompanying drawings.

DESCRIPTION OF EMBODIMENTS

Figure 1:
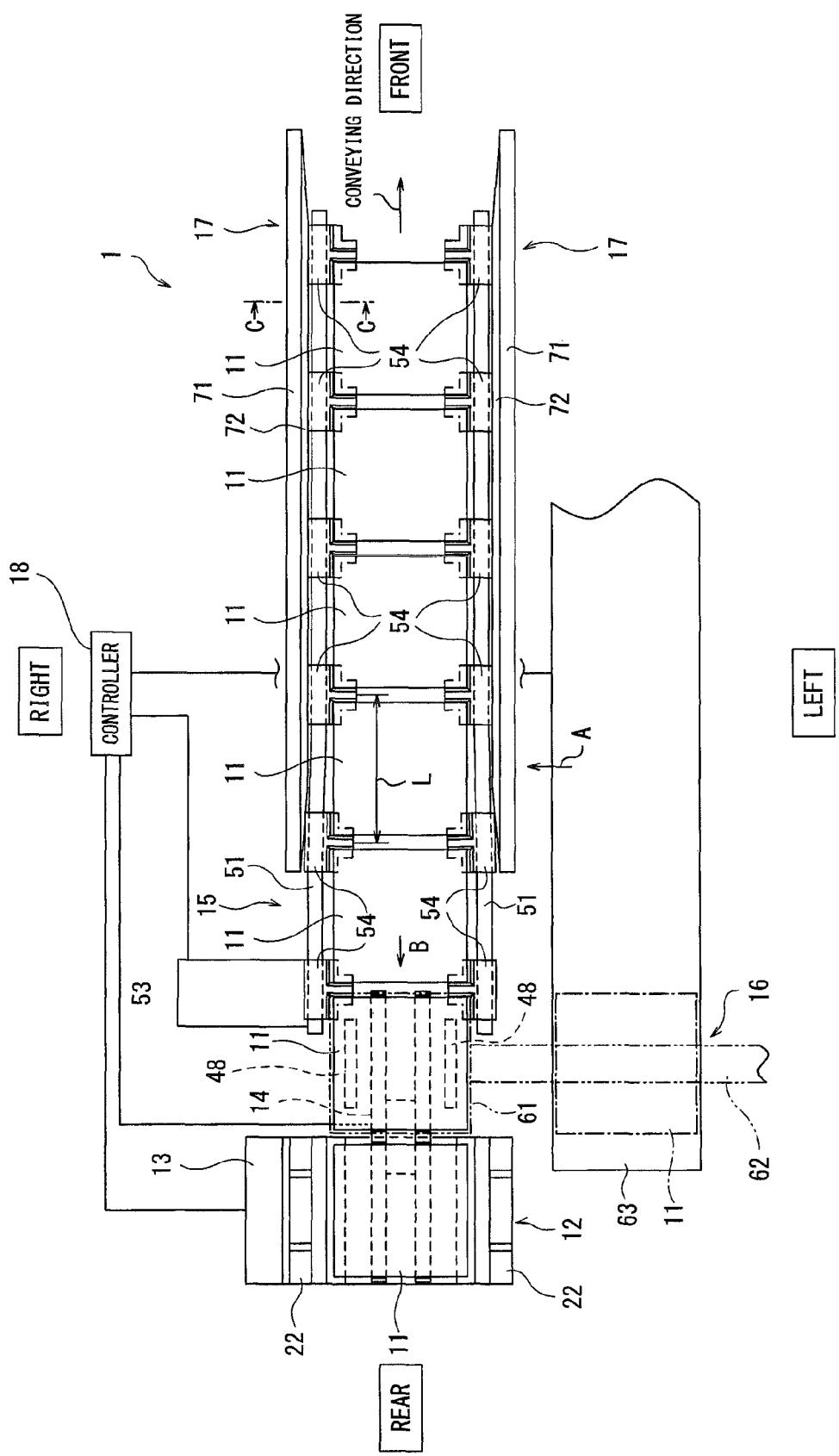
FIG. 1 is a plan view showing the configuration of a carry-out conveyance system.

Hereinafter, a conveyance system 1 according to one embodiment of the present invention is described with reference to the drawings. In the drawings, the same or corresponding elements are denoted by the same reference signs, and repeating the same descriptions is avoided below. Although directions are mentioned in the description below for the sake of convenience of the description, it does not mean that the directions are thus limited. Conveyance systems 1 and 1A described below are merely an embodiment of the present invention. Therefore, the present invention is not limited to the embodiment below, and additions, deletions, and modifications can be made to the embodiment without departing from the spirit of the present invention.

[Carry-Out Conveyance System]

Figure 2:
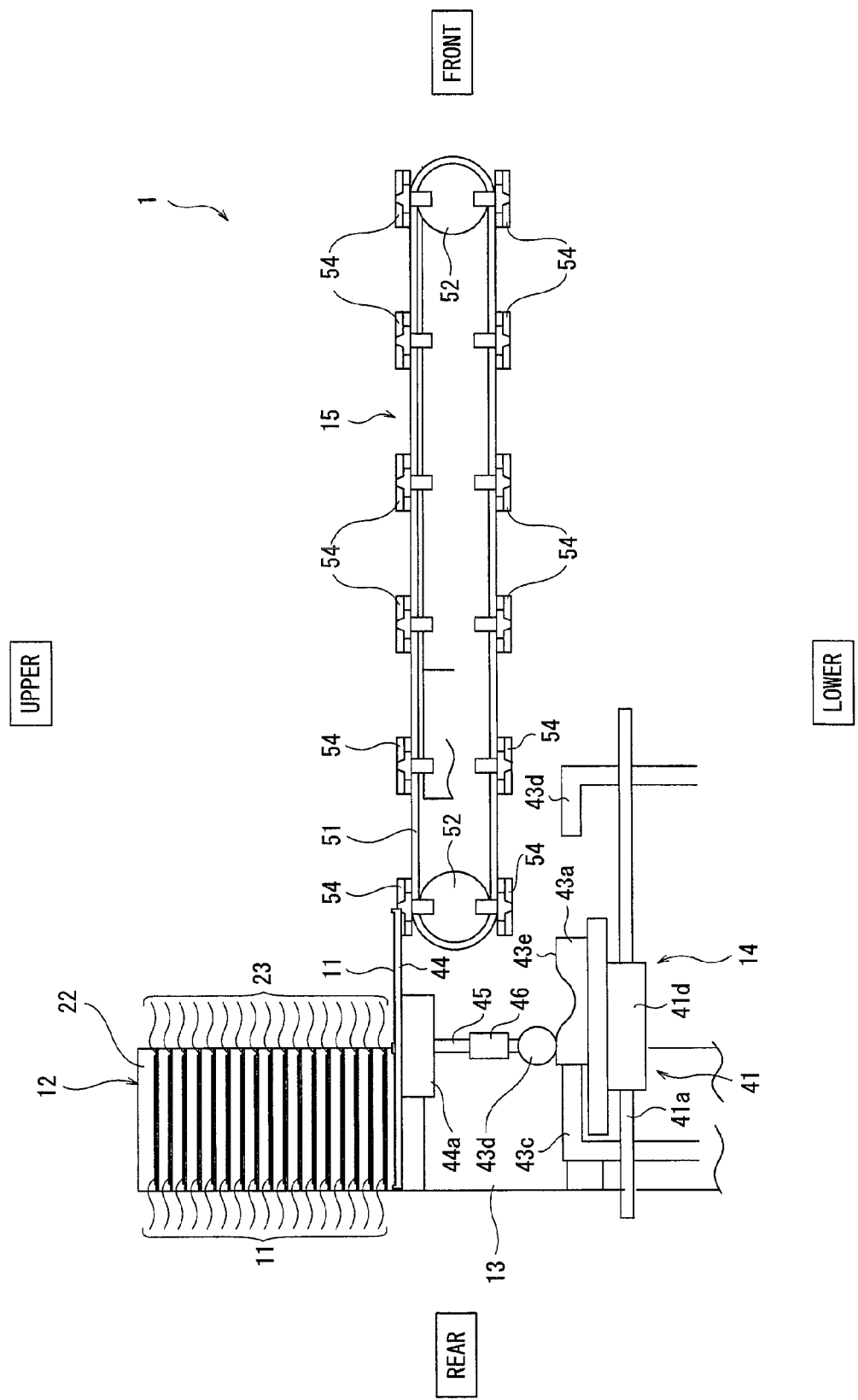
FIG. 2 is a side view of the conveyance system of FIG. 1 as viewed in the direction of an arrow A of FIG. 1.

The conveyance system 1 is a carry-out conveyance system for taking a plurality of substrates 11 out of a storage case 12 one by one and conveying each substrate 11 to a predetermined position. As shown in FIG. 1 and FIG. 2, the conveyance system 1 includes the storage case 12, a lifting/lowering apparatus 13, a handover apparatus 14, a conveying apparatus 15, a transfer apparatus 16, and space-restricting mechanisms 17.

<Storage Case>

Figure 3:
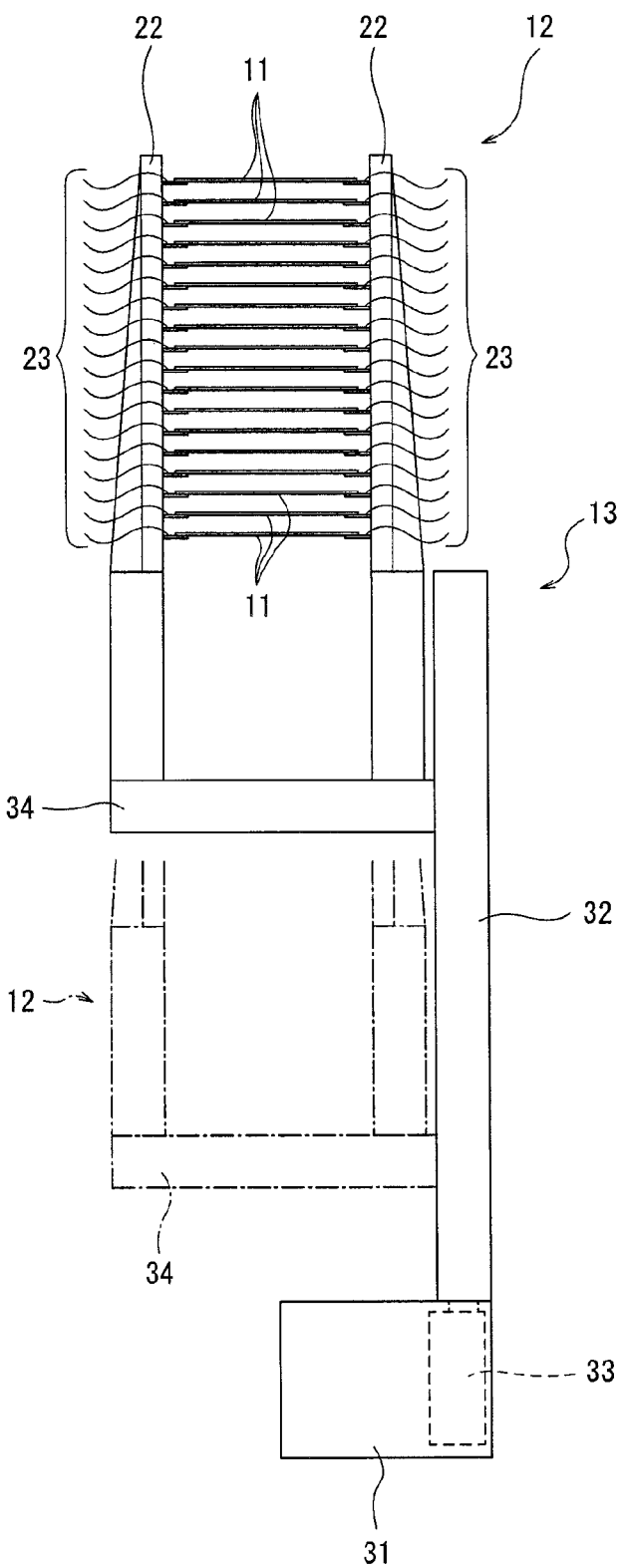
FIG. 3 is a front view of a lifting/lowering apparatus included in the conveyance system of FIG. 1, as viewed in the direction of an arrow B of FIG. 1.

As shown in FIG. 3, the storage case 12 includes a pair of side walls 22. The side walls 22 are positioned at left and right sides of the storage case 12, respectively, such that the inner surfaces of the respective side walls 22 face each other. A plurality of support plates 23 are provided on each of the inner surfaces of the respective side walls 22, such that each of the support plates 23 on one inner surface corresponds to a respective one of the support plates 23 on the other inner surface. The support plates 23 are arranged at regular intervals in the vertical direction, such that the support plates 23 on the inner surface of each side wall 22 extend to protrude toward the other side wall 22. The upper surface of each support plate 23 provided on one side wall 22 is substantially flush with the upper surface of the corresponding support plate 23 provided on the other side wall 22. The two support plates 23 corresponding to each other, i.e., a pair of support plates 23, support both side edges of a substrate 11. The substrate 11 is stored in the storage case 12 in such a manner that the substrate 11 is inserted between the pair of side walls 22 and the substrate 11 is supported by the pair of support plates 23. The storage case 12, which stores substrates 11 in such a manner, is mounted on the lifting/lowering apparatus 13.

<Lifting/Lowering Apparatus>

The lifting/lowering apparatus 13 includes a base 31, a ball screw mechanism 32, a driving motor 33, and a lifting/lowering stand 34. The base 31 is formed roughly in the shape of a box. The base 31 includes the vertically extending ball screw mechanism 32. The base 31 includes the driving motor 33 therein. The driving motor 33 is a servomotor configured to drive the rotation of a ball screw (not shown) of the ball screw mechanism 32, thereby lifting and lowering a slider (not shown) provided on the ball screw. The lifting/lowering stand 34 is provided on the slider. The lifting/lowering stand 34 extends in the horizontal direction. The storage case 12 is mounted on the lifting/lowering stand 34. The lifting/lowering apparatus 13 with the above configuration is configured to drive the ball screw mechanism 32 by means of the driving motor 33, thereby lifting and lowering the storage case 12 mounted on the lifting/lowering stand 34. The lifting/lowering apparatus 13 is configured to lower the storage case 12, thereby lowering each substrate 11 to a receiving position at a predetermined height. At the front of the lifting/lowering apparatus 13 thus configured, the handover apparatus 14 is disposed.

<Handover Apparatus>

Figure 4:
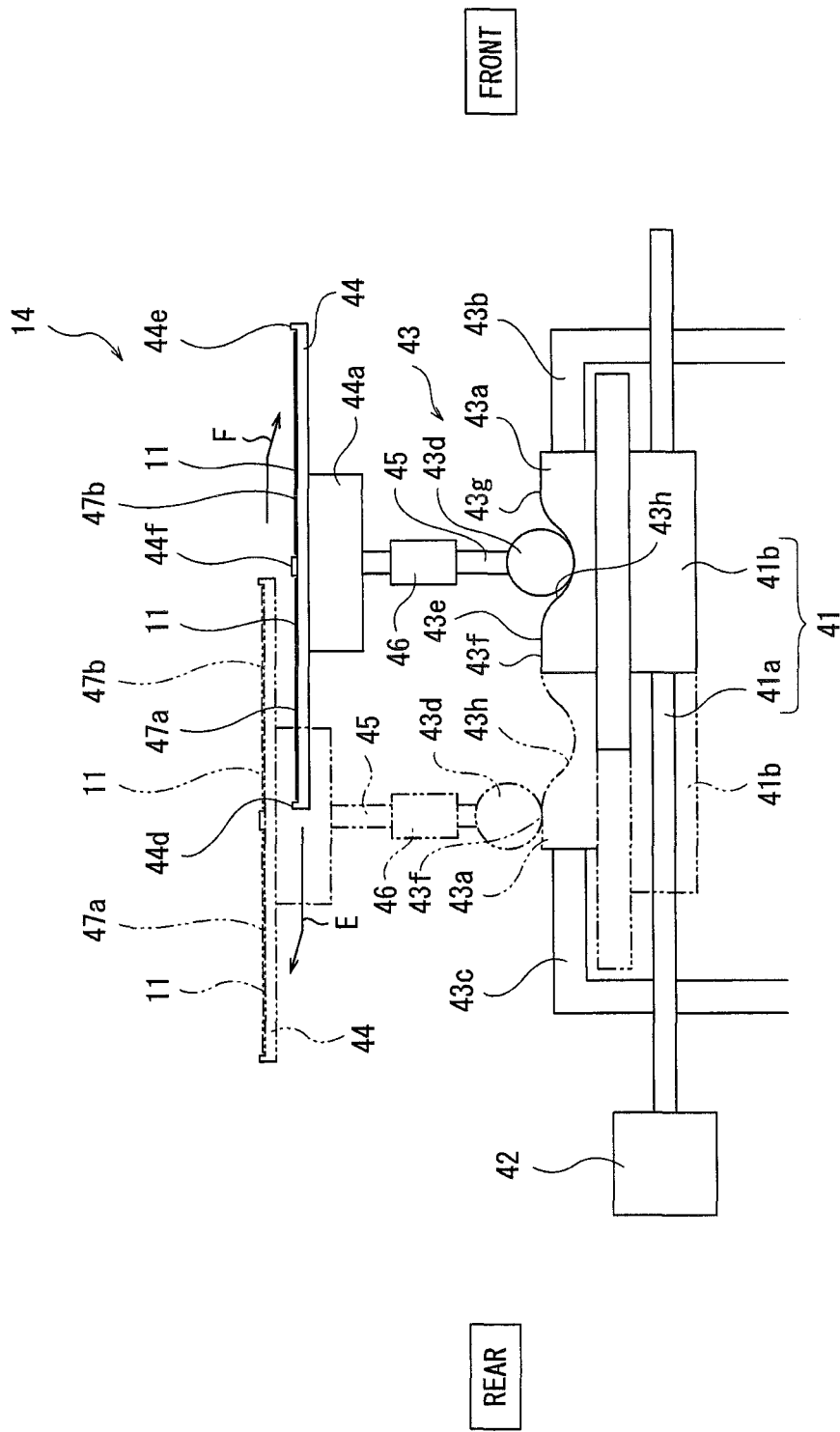
FIG. 4 is an enlarged side view showing, in an enlarged manner, the configuration of a handover apparatus included in the conveyance system of FIG. 1.

The handover apparatus 14 is configured to receive the substrate 11 that has been lowered by the lifting/lowering apparatus 13 to the receiving position, and transfer the substrate 11 to a handover position described below (see solid lines and two-dot chain lines in FIG. 2). As shown in FIG. 4, the handover apparatus 14 includes a slider mechanism 41, a driving mechanism 42, a cam mechanism 43, and a placing stand 44. The slider mechanism 41 includes a guide member 41a and a slide member 41b. The guide member 41a extends in the front-rear direction. The slide member 41b is provided on the guide member 41a, such that the slide member 41b is slidable in the front-rear direction. The slider mechanism 41 thus configured is provided with the driving mechanism 42.

The driving mechanism 42, which is a moving unit, includes an electric motor and a belt, for example. The driving mechanism 42 is configured to move the slide member 41b in the front-rear direction by moving the belt with the electric motor. It should be noted that the driving mechanism 42 may alternatively be configured to move the slide member 41b by expanding and contracting a cylinder by supply and exhaust of air. The upper surface of the slide member 41b is flat, and the cam mechanism 43 is provided on the upper surface.

The cam mechanism 43 includes a cam 43a, a pair of stopper members 43b and 43c, and a cam follower 43d. The cam 43a is provided on the upper surface of the slide member 41b. A guide (not shown) is provided on the upper surface of the slide member 41b, and the cam 43a is configured to be slidingly movable in the front-rear direction via the guide. Fundamentally, the cam 43a thus configured does not move relative to the slide member 41b in the front-rear direction. The stopper members 43b and 43c are provided at the front and the rear of the cam 43a, respectively.

The stopper members 43b and 43c are disposed such that each stopper member stops the cam 43a from moving when coming into contact with the cam 43a so that the cam 43a will not move forward or rearward from a predetermined position. Accordingly, while the slide member 41b is moving forward or rearward, when the cam 43a comes into contact with the stopper member 43b or 43c, the cam 43a stops and stays there, so that the cam 43a makes relative movement relative to the sliding member 41b in a direction opposite to the moving direction of the slide member 41b. The cam 43a moving in such a manner has a cam face 43e at its upper surface. The cam follower 43d is on the cam face 43e.

The cam follower 43d is configured to move in the front-rear direction on the cam face 43e while rotating. The cam mechanism 43 includes a vertically extending arm 45. The cam follower 43d is rotatably provided on the lower end of the arm 45. The arm 45 is supported by a support 46 fixed to the slide member 41b, such that the arm 45 is movable in the vertical direction. Accordingly, the arm 45 is configured to be not movable relative to the slide member 41b in the front-rear direction, but movable relative to the slide member 41b in the vertical direction. That is, the cam follower 43d is not movable relative to the slide member 41b in the front-rear direction. The cam follower 43d is movable relative to the cam 43a in the front-rear direction. Through the relative movement, the cam follower 43d moves on the cam face 43e such that the cam follower 43d moves up and down in accordance with the shape of the cam face 43e.

Here, a description of the shape of the cam face 43e is given. The cam face 43e has flat portions 43f and 43g and a recess 43h lower than the flat portions 43f and 43g. The recess 43h is positioned at the middle portion of the cam face 43e in the front-rear direction. When the cam 43a has come into contact with the front-side stopper member 43b and the slide member 41b has moved to its forefront position, the cam follower 43d enters the recess 43h. The flat portions 43g and 43f are positioned at the front and the rear of the recess 43h of the cam face 43e, respectively. When the cam 43a has come into contact with the rear-side stopper member 43c and the slide member 43b has moved to its rearmost position, the cam follower 43d moves onto the rear-side flat portion 43f. Thus, the arm 45 moves up and down when the slide member 41b moves in the front-rear direction and the cam follower 43d moves on the cam face 43e. The placing stand 44 is provided on the upper end of the arm 45.

Figure 5:
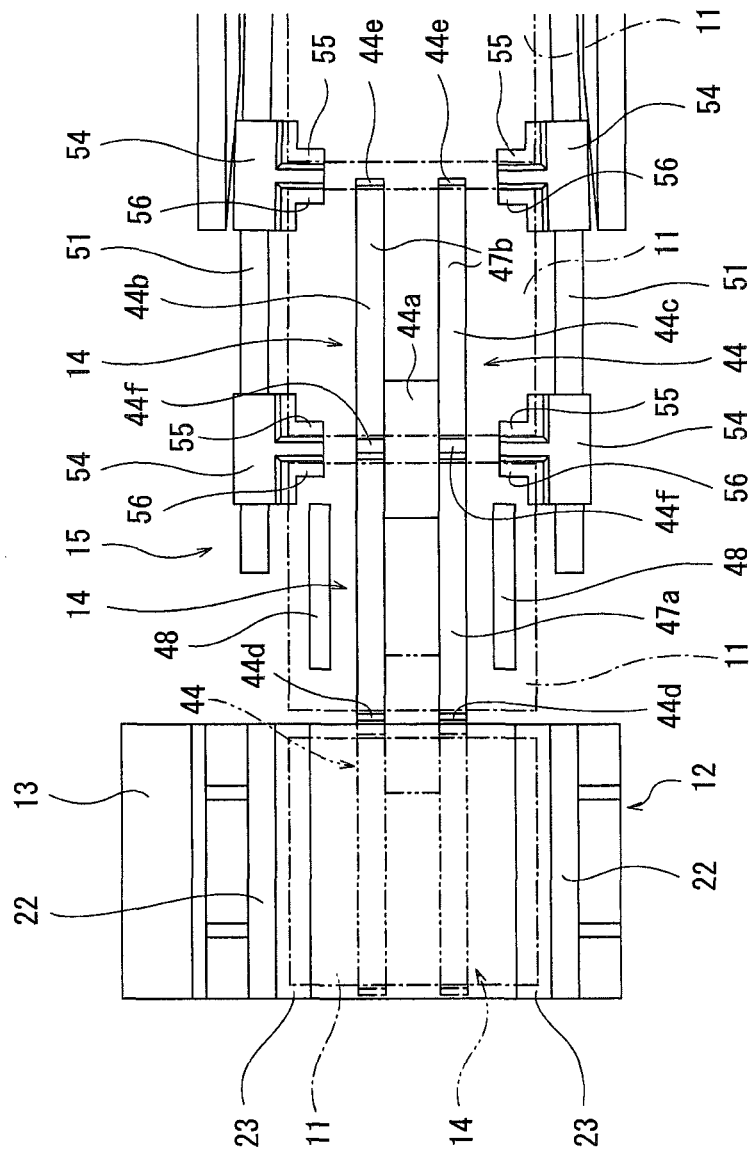
FIG. 5 is an enlarged plan view showing, in an enlarged manner, the handover apparatus and the vicinity thereof in the conveyance system of FIG. 1.

The placing stand 44 includes a base portion 44a and a pair of plate-shaped members 44b and 44c (see also FIG. 5). The base portion 44a is formed roughly in the shape of a rectangular parallelepiped, and is provided on the upper end of the arm 45. The pair of plate-shaped members 44b and 44c is provided on the upper surface of the base portion 44a. The pair of plate-shaped members 44b and 44c is a pair of strip-shaped plate members extending in the front-rear direction. The pair of plate-shaped members 44b and 44c is arranged such that the plate-shaped members 44b and 44c are parallel to each other and spaced apart from each other in the left-right direction. The pair of plate-shaped members 44b and 44c is configured such that the substrate 11 can be placed thereon.

Protruding members 44d, 44e, and 44f are formed at rear ends, front ends, and central portions of the plate-shaped members 44b and 44c. The protruding members 44d, 44e, and 44f protrude upward from the upper surfaces of the plate-shaped members 44b and 44c. The protruding members 44d, 44e, and 44f are arranged such that protruding members adjoining in the front-rear direction are spaced apart from each other by a distance that is slightly greater than the length of a substrate 11 in the front-rear direction. On the upper surfaces of the plate-shaped members 44b and 44c, a rear-side placing area 47a is formed between the rear-side and central protruding members 44d and 44f, and a front-side placing area 47b is formed between the front-side and central protruding members 44e and 44f. The protruding members 44d, 44e, and 44f are configured to restrict, in the front-rear direction, the movement of a substrate 11 placed on the rear-side placing area 47a and a substrate 11 placed on the front-side placing area 47b. The rear-side placing area 47a and the front-side placing area 47b are provided with a suction adhesion mechanism (not shown). The suction adhesion mechanism is configured to adhere to the substrates 11 by suction so that, while the substrates 11 are being moved, the substrates 11 will not fall from the rear-side placing area 47a and the front-side placing area 47b.

The rear-side placing area 47a, which is a first area, is configured to receive a substrate 11 at the aforementioned receiving position. Forward from the receiving position, a testing position and the handover position are arranged. A pair of supports 48 is provided at the testing position, which is a middle position. The pair of supports 48 is, when seen in the left-right direction, positioned outside the pair of plate-shaped members 44b and 44c, and is configured to support a substrate 11 with the upper surfaces of the pair of supports 48. The rear-side placing area 47a is configured to move between the receiving position and the testing position owing to the movement of the slide member 41b in the front-rear direction. The front-side placing area 47b, which is a second area, is configured to be positioned at the testing position when the rear-side placing area 47a is positioned at the receiving position, and be positioned at the receiving position when the rear-side placing area 47a is positioned at the testing position. That is, the front-side placing area 47b is configured to move between the testing position and the handover position owing to the movement of the slide member 41b in the front-rear direction.

In the handover apparatus 14 thus configured, when the slide member 41b moves rearward, the placing stand 44 moves rearward toward the receiving position. When the rear-side placing area 47a comes close to the receiving position, the cam 43a comes into contact with the rear-side stopper member 43c, and thereby the cam 43a stops moving. In this state, when the slide member 41b moves further rearward, the cam follower 43d moves rearward on the cam face 43e, thereby moving from the recess 43h onto the flat portion 43f, so that the placing stand 44 is lifted. When the cam follower 43d is positioned in the recess, the rear-side placing area 47a and the front-side placing area 47b are positioned at respective positions lower than the receiving position and the testing position. Accordingly, as a result of the placing stand 44 being lifted, the rear-side placing area 47a is lifted from the lower position toward the receiving position, and the front-side placing area 47b is lifted from the lower position toward the testing position (see an arrow E in FIG. 4). Then, the rear-side placing area 47a reaches the receiving position and the front-side placing area 47b reaches the testing position substantially at the same time (see two-dot chain lines in FIG. 4 and FIG. 5).

When the rear-side placing area 47a has reached the receiving position, a substrate 11 positioned at the receiving position is placed onto the rear-side placing area 47a. When the front-side placing area 47b has reached the testing position, a substrate 11 that has been staying on the pair of supports 48 is placed onto the front-side placing area 47b. In the state where the substrates 11 are placed on the respective placing areas, when the slide member 41b is further moved rearward, the rear-side placing area 47a and the front-side placing area 47b are further lifted, so that the substrates 11 placed thereon are lifted from the pair of support plates 23 and the pair of supports 48, respectively. In this manner, the handover apparatus 14 receives the substrate 11 positioned at the receiving position and the substrate 11 positioned at the testing position.

After the handover apparatus 14 receives the substrates 11, when the slide member 41b is moved forward, the placing stand 44 moves forward. At the time, the placing stand 44 moves with the cam follower 43d kept positioned on the flat portion 43f, so that the placing stand 44 moves horizontally at an elevation higher than the receiving position and the testing position. Then, when the rear-side placing area 47a comes close to the testing position, the cam 43a comes into contact with the front-side stopper member 43b, and thereby the cam 43a stops moving. In this state, when the slide member 41b moves further forward, the cam follower 43d moves from the flat portion 43f down into the recess 43h, so that the placing stand 44 is lowered. As a result, the rear-side placing area 47a is lowered toward the testing position, and the front-side placing area 47b is lowered toward the handover position (see an arrow F in FIG. 4). Then, the rear-side placing area 47a reaches the testing position and the front-side placing area 47b reaches the handover position substantially at the same time (see solid lines in FIG. 4 and FIG. 5).

When the rear-side placing area 47a has reached the testing position, the substrate 11 on the rear-side placing area 47a is placed onto the pair of supports 48. When the front-side placing area 47b has reached the handover position, the substrate 11 on the front-side placing area 47b is placed onto the conveying apparatus 15 described below. In this state, when the slide member 41b is further moved forward, the rear-side placing area 47a and the front-side placing area 47b are further lowered and removed from the respective substrates 11. In this manner, the substrates 11 are handed over to the pair of supports 48 and the conveying apparatus 15.

As described above, by moving the placing stand 44 in the front-rear direction by the driving mechanism 42, the placing stand 44 can be lifted and lowered by the cam mechanism 43 so that a substrate 11 can be placed onto the placing stand 44 at the receiving position and a substrate 11 on the placing stand 44 can be handed over to the conveying apparatus 15 at the handover position. In this manner, the driving mechanism for moving the placing stand 44 can serve as a driving mechanism for lifting and lowering the placing stand 44. This makes it possible to reduce the number of components.

<Conveying Apparatus>

The conveying apparatus 15 is configured to receive a substrate 11 placed on the placing area 47b at the handover position, and then convey the substrate 11 to a predetermined position. As shown in FIG. 1 and FIG. 2, fundamentally, the conveying apparatus 15 includes a pair of belts 51, a plurality of pulleys 52, a driving motor 53, and a plurality of profiles 54. The pair of belts 51, which serves as conveying belts, is a pair of endless annular toothed belts. The belts 51 extend in the front-rear direction, and are spaced apart from each other in the left-right direction. The pulleys 52 are disposed at the front and rear portions of each belt 51, respectively. Each belt 51 stretches between the two front and rear pulleys 52. The two pulleys 52 disposed at the front side are both connected to an output shaft of the driving motor 53, which is a conveying unit. By driving the driving motor 53, the pulleys 52 rotate, causing the pair of belts 51 to move in synchronization with each other. Each of the pair of belts 51 moving in synchronization with each other is provided with the plurality of profiles 54.

The profiles 54, which are support members, are configured to support corner portions of substrates 11. As shown in FIG. 1, the profiles 54 are arranged at regular intervals in the front-rear direction such that the center-to-center distance of the profiles 54 is a predetermined pitch L. The predetermined pitch L herein is substantially the same as the length of a substrate 11 in the front-rear direction. To be more specific, the predetermined pitch L is set to be slightly greater than the length of the substrate 11 in the front-rear direction. Each of the profiles 54 disposed on one belt 51 is associated with one of the profiles 54 disposed on the other belt 51. Such a pair of associated profiles 54 is positioned such that the profiles 54 face each other. Each pair of profiles 54 is associated with an adjacent pair of profiles 54 positioned at their front side, and also associated with an adjacent pair of profiles 54 positioned at their rear side. Such four profiles 54 associated with each other (which may hereinafter be simply referred to as "four profiles 54") form a placing area inside them. The shape of the placing area is substantially the same as the shape of a substrate 11. The four corners of a substrate 11 disposed in the placing area are placed on the four profiles 54, respectively, and thus the four profiles 54 support the substrate 11. On the pair of belts 51, multiple sets of such four profiles 54 are arranged in the front-rear direction at regular intervals. Accordingly, placing areas are formed between the pair of belts 51 at regular intervals. If substrates 11 are placed on all of the placing areas positioned on the profiles 54, then as shown in FIG. 1, the substrates 11 are arranged in the front-rear direction at regular intervals.

Figure 6:
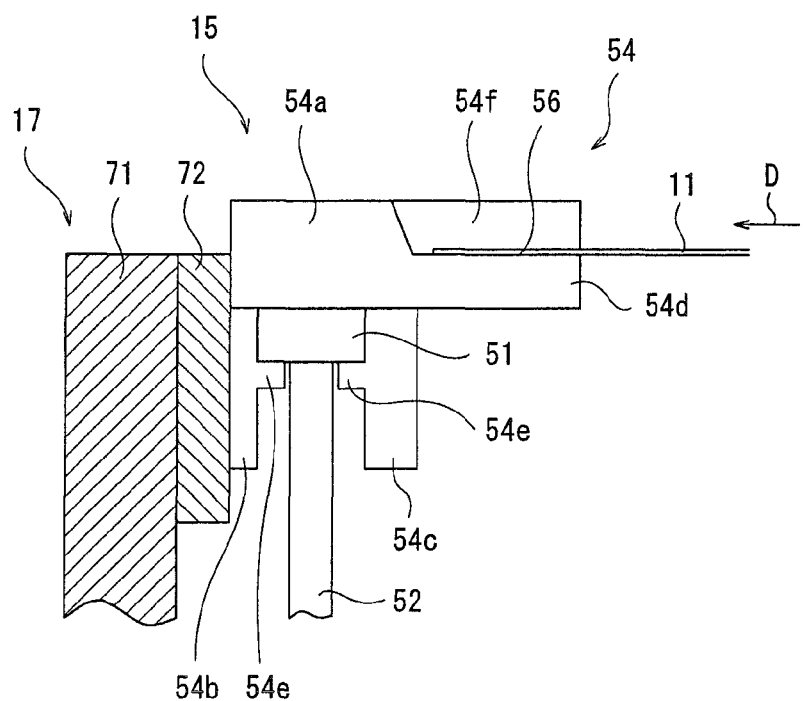
FIG. 6 is an enlarged sectional view of a conveying apparatus included in the conveyance system of FIG. 1, the view being taken along a cutting-plane line C-C of FIG. 1.
Figure 7:
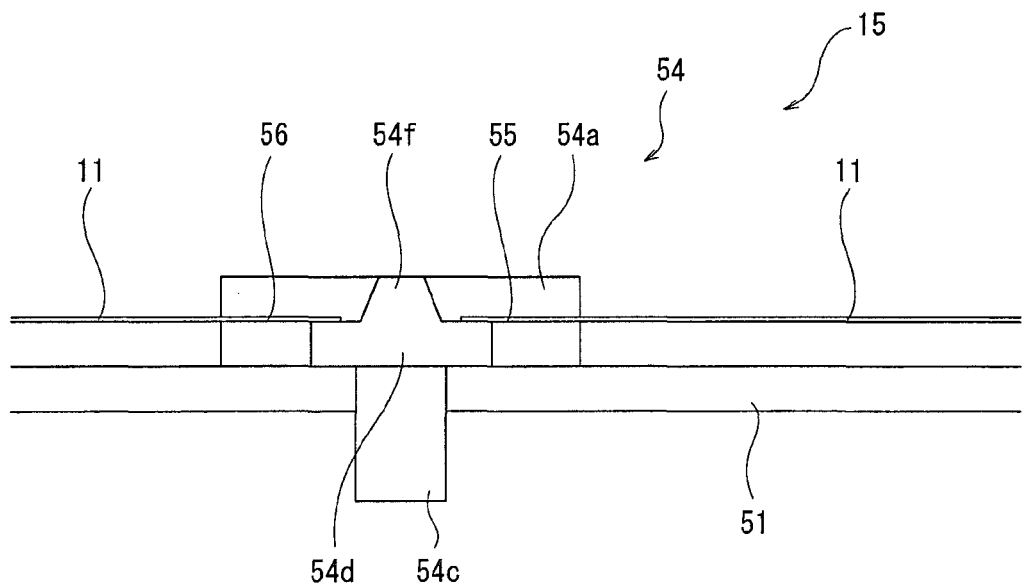
FIG. 7 is a side view of a profile of FIG. 6 as viewed in the direction of an arrow D of FIG. 6.
Figure 8:
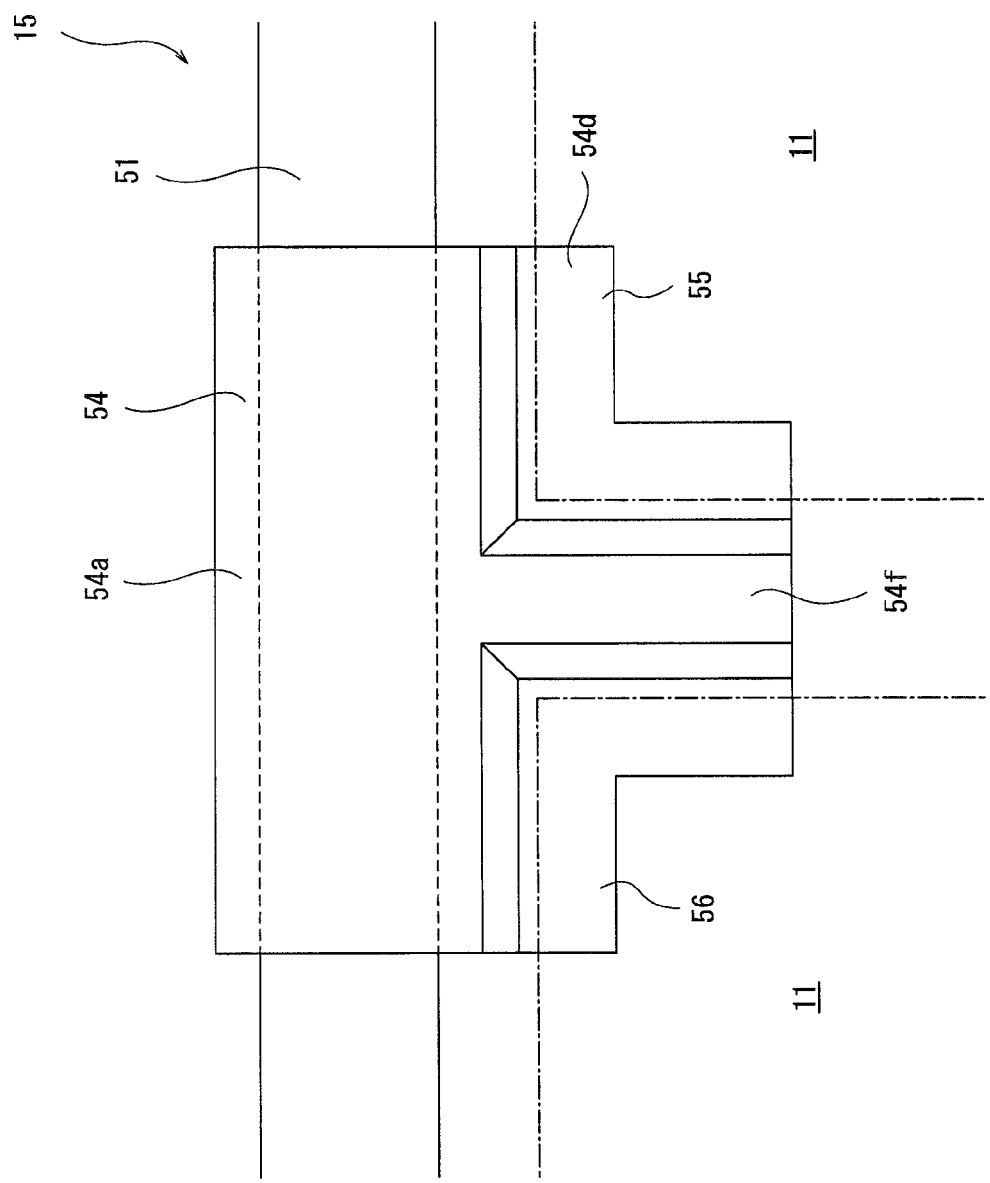
FIG. 8 is an enlarged top plan view of the profile of FIG. 6.

Each of the profiles 54 having the above-described function is formed roughly in the shape of T when seen in plan view. As shown in FIG. 6 to FIG. 8, each profile 54 includes a base portion 54a, a pair of locking portions 54b and 54c, and a support portion 54d. The base portion 54a is formed roughly in the shape of a rectangle extending in the front-rear direction along the belt 51, and is disposed on the belt 51. The pair of locking portions 54b and 54c is provided on the lower end surface of the base portion 54a. The locking portions 54b and 54c are positioned at both sides of the belt 51 in the left-right direction, respectively, and are in contact with the left and right side surfaces of the belt 51. Each of the pair of locking portions 54b and 54c has a protrusion 54e, such that the protrusion 54e of one of the locking portions 54b and 54c protrudes toward the protrusion 54e of the other one of the locking portions 54b and 54c. Each protrusion 54e is in contact with the lower surface of the belt 51. Accordingly, the belt 51 is surrounded by the base portion 54a and the pair of locking portions 54b and 54c. This prevents the profile 54 from being detached from the belt 51. Moreover, each protrusion 54e is meshed with teeth (not shown) formed on the lower surface of the belt 51. Accordingly, the pair of locking portions 54b and 54c is fixed to the belt 51 in the front-rear direction. It should be noted that the protrusions 54e are formed such that the distal ends of the respective protrusions 54e are spaced apart from each other in the left-right direction, allowing the pulley 52 to pass between the distal ends. The support portion 54d is integrally formed on the base portion 54a which is fixed to the belt 51 in the above-described manner.

The support portion 54d is a plate-shaped member integrally provided on one side of the base portion 54a. The middle portion, in the front-rear direction, of the support portion 54d of each profile 54 protrudes toward the base portion 54a of the associated profile 54. That is, the support portion 54d is formed roughly in the shape of T when seen in plan view. The support portion 54d includes a raised portion 54f formed at its central portion in the front-rear direction. The raised portion 54f is raised from the other portions of the support portion 54d. The upper surface of the raised portion 54f is flush with the upper surface of the base portion 54a. Support areas 55 and 56 are formed at the front and the rear of the raised portion 54f, respectively. Each of the support areas 55 and 56 is formed roughly in the shape of L when seen in plan view. The upper surfaces of the respective support areas 55 and 56 can support corner portions of different substrates 11. Each of the support areas 55 and 56 of each profile 54 forms a placing area together with the support areas 55 and 56 of the other three associated profiles 54, and the four support areas support the four respective corners of a substrate 11.

The front and rear side surfaces of the raised portion 54f are formed as tapered surfaces such that the extension of the front and rear side surfaces toward the support areas 55 and 56 increases as descending along the front and rear side surfaces. Similarly, one side surface of the base portion 54a is formed as a tapered surface such that the extension of the one side surface toward the support areas 55 and 56 increases as descending along the one side surface. Accordingly, when corner portions of substrates 11 come into contact with the front and rear side surfaces of the raised portion 54f and the one side surface of the base portion 54a, the corner portions are guided by these tapered surfaces to prescribed positions on the support areas 55 and 56. Thus, by merely placing a substrate 11 on the profiles 54 that are associated with each other, the positioning of the four corners of the substrate 11 is made such that the substrate 11 is positioned to a prescribed position inside the four profiles 54.

The conveying apparatus 15 with the above-described configuration is configured to drive the pair of belts 51 in synchronization with each other by means of the driving motor 53, thereby positioning four profiles 54 to the handover position. When seen in plan view, the four profiles 54 positioned at the handover position overlap the four respective corners of a substrate 11 that has been conveyed to the handover position by the handover apparatus 14, and the four profiles 54 support the four respective corners. That is, the conveying apparatus 15 is configured to receive, by means of the four profiles 54, the substrate 11 that has been conveyed to the handover position by the handover apparatus 14. Moreover, the conveying apparatus 15 is configured to guide and position the received substrate 11 to the prescribed position by means of the four profiles 54, and convey the received substrate 11 in the forward conveying direction.

<Transfer Apparatus>

A testing device, which is not shown, is provided above the testing position. The testing device is configured to detect the condition of each substrate 11, specifically, detects a defective product that is, for example, damaged or chipped. The transfer apparatus 16 is provided in order to remove, based on the result of the detection by the testing device, such a defective product from a conveying path, which extends from the receiving position through the testing position and the handover position to a conveyance destination at the front of the conveying apparatus 15.

As shown in FIG. 1, the transfer apparatus 16 includes a suction adhesion hand 61 (see two-dot chain lines in FIG. 1), a cylinder mechanism 62 (see two-dot chain lines in FIG. 1), and a conveyor 63. The suction adhesion hand 61 is disposed at a suction adhesion position above a substrate 11 positioned at the testing position. The suction adhesion hand 61 is configured to adhere to the upper surface of the substrate 11 by suction. The suction adhesion hand 61 is provided with the cylinder mechanism 62. The cylinder mechanism 62 is configured to expand and contract in the left-right direction, and by means of the expansion and contraction, move the suction adhesion hand 61 between the suction adhesion position and a release position. The suction adhesion hand 61 is configured to release the adhesion to the substrate 11 at the release position to drop the substrate 11 below the release position. The conveyor 63 is provided below the release position. The dropped substrate 11 is transferred by the conveyor 63 to a chute, which is not shown.

The transfer apparatus 16 with the above-described configuration performs the following operations: first, cause the suction adhesion hand 61 to adhere to a substrate 11 at the testing position by suction and lift the substrate 11; then operate the cylinder mechanism 62 to move the suction adhesion hand 61 from the suction adhesion position to the release position; subsequently, release the adhesion of the suction adhesion hand 61 to the substrate 11, thereby releasing and dropping the substrate 11 from the suction adhesion hand 61 onto the conveyor 63; and thereafter, transfer the substrate 11 to the chute by means of the conveyor 63. In this manner, the transfer apparatus 16 can transfer a defective substrate 11 positioned at the testing position in a direction different from the conveying direction, thereby removing the defective substrate 11 from the conveying path.

<Space-Restricting Mechanism>

Figure 9:
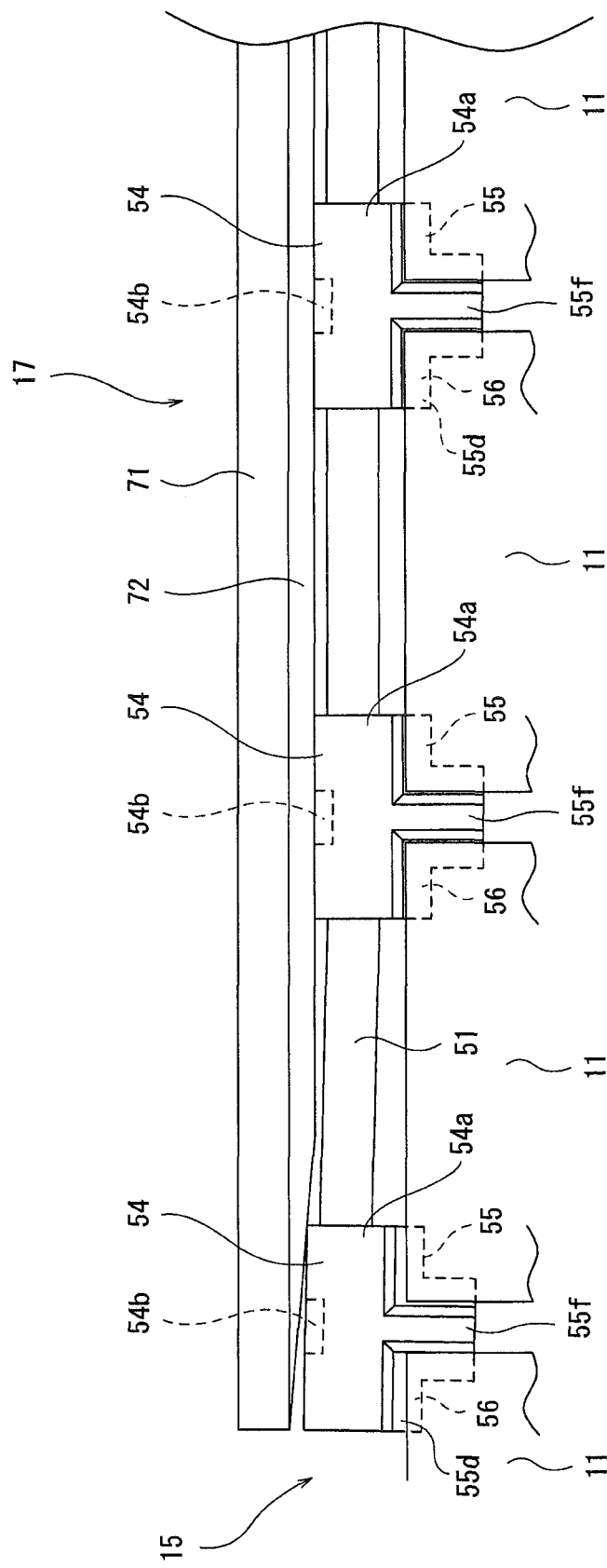
FIG. 9 is an enlarged plan view showing, in an enlarged manner, a space-restricting mechanism included in the conveyance system of FIG. 1.

Forward from the handover position, the space-restricting mechanisms 17 are provided at the rear left side and rear right side of the conveying apparatus 15, respectively. The space-restricting mechanisms 17 are mechanisms configured to restrict and narrow down the space between the pair of belts 51 in the left-right direction. As shown in FIG. 1, one space-restricting mechanism 17 and the other space-restricting mechanism 17 are provided outside the pair of belts 51, respectively. As shown in FIG. 9, each space-restricting mechanism 17 includes a base 71 and a restricting portion 72. The bases 71 extend in the front-rear direction, and are positioned outside the belts 51 in the left-right direction. The side surface of each base 71 at the belt 51 side faces the outer locking portions 54b of respective profiles 54. The restricting portion 72 is provided on the side surface of each base 71 at the belt 51 side.

The restricting portion 72 is formed roughly in the shape of a trapezoid when seen in plan view. The distal end portion of the restricting portion 72 at the receiving position side is formed to have a slope, such that as advancing forward along the slope, the distal end portion becomes closer to the belt 51. The middle portion of the restricting portion 72 extends parallel to the belt 51. The restricting portion 72 thus formed is disposed so as to come into contact with the outer locking portions 54b of respective profiles 54 that pass the front of the restricting portion 72. By coming into contact with the outer locking portions 54b of the profiles 54, the restricting portion 72 pushes the profiles 54 toward the other belt 51 (see also FIG. 6). In this manner, the space between the pair of belts 51 is narrowed down, and the space between the profiles 54 of each pair of profiles 54 is narrowed down.

By narrowing down the space between the pair of profiles 54 in such a manner, the space between the one side surfaces of the respective base portions 54a of the pair of profiles 54 becomes substantially the same as the width of a substrate 11. Accordingly, the side surfaces of the substrate 11 are sandwiched by the left-side and right-side base portions 54a, which serve as positioning portions, and thereby the positioning of the substrate 11 in the left-right direction is performed. Providing the restricting portion 72 in such a manner makes it possible to perform precise positioning of the substrate 11 in the left-right direction while conveying the substrate 11 by moving the profiles 54. This makes it possible to eliminate a stop time for performing the positioning of the substrate 11, and reduce a time required for the conveyance and positioning of the substrate 11. Meanwhile, the restricting portion 72 does not reach the handover position. Therefore, at the handover position, the space between the pair of profiles 54 is still wide such that the space between the one side surfaces of the respective base portions 54a of the pair of profiles 54 is slightly greater than the width of the substrate 11. In this manner, an allowable range of deviation from proper substrate positioning when the substrate 11 is handed over at the handover position from the handover apparatus 14 to the conveying apparatus 15 can be made great, which allows the substrate 11 to be readily placed onto the four profiles 54.

<Controller>

The conveyance system 1 with the above-described configuration further includes a controller 18 as shown in FIG. 1. The controller 18 controls the operations of the lifting/lowering apparatus 13, the handover apparatus 14, and the conveying apparatus 15. Hereinafter, a conveying operation performed by the controller 18 is described in detail.

<Operation of Conveyance System>

The controller 18 drives the driving motor 33 of the lifting/lowering apparatus 13 to lower the lifting/lowering stand 34, such that the lowermost substrate 11 in the storage case 12 is lowered to the receiving position. The controller 18 stops driving the driving motor 33 when the lowermost substrate has reached the receiving position. Next, the controller 18 moves the slide member 41b rearward by means of the driving mechanism 42. By moving the slide member 41b rearward, the rear-side placing area 47a of the placing stand 44 moves to the receiving position, and the substrate 11 at the receiving position is placed onto the rear-side placing area 47a. At the same time, the front-side placing area 47b moves to the testing position, and the substrate 11 that is being supported by the pair of supports 48 is placed onto the front-side placing area 47b. After the substrates 11 are placed onto the rear-side placing area 47a and the front-side placing area 47b, the controller 18 further moves the slide member 41b rearward. As a result, the rear-side placing area 47a and the front-side placing area 47b lift and receive the two substrates 11 from the support plates 23 and the supports 47, respectively.

After the two substrates 11 are lifted, the controller 18 moves the slide member 41b forward by means of the driving mechanism 42. As a result, the placing stand 44, on which the two substrates 11 are placed, moves forward at a higher elevation than the receiving position and the testing position. Then, when the rear-side placing area 47a has come close to the testing position and the front-side placing area 47b has come close to the handover position, the placing stand 44 starts to be lowered. In this state, the placing stand 44 is kept moving forward. As a result, the rear-side placing area 47a reaches the testing position, and the substrate 11 on the rear-side placing area 47a is placed onto the pair of supports 48. At the same time, the front-side placing area 47b reaches the handover position.

In the conveying apparatus 15, four profiles 54 are positioned at the four corners of the handover position, respectively. When the front-side placing area 47b has reached the handover position, the four corners of the substrate 11 on the front-side placing area 47b are placed onto the four profiles 54, respectively. After the four corners of the substrate 11 are placed onto the four profiles 54, the slide member 41b is further moved forward, and thereby the front-side placing area 47b is removed from the substrate 11, and thus the substrate 11 is handed over to the four profiles 54. Similarly, the substrate 11 on the rear-side placing area 47a is handed over to the pair of supports 48, and positioned to the testing position.

The condition of the substrate 11 positioned to the testing position in the above manner is tested by the testing device, which is not shown. Test results are transmitted to the controller 18. If it is determined that the substrate 11 is a defective product, the controller 18 causes the suction adhesion hand 11 to adhere to the defective substrate 11 by suction and move the defective substrate 11 onto the conveyor 63, and causes the conveyor 63 to move the defective substrate 11 to the chute. If it is determined that the substrate 11 is not defective, the controller 18 does not drive the transfer apparatus 16, so that the substrate 11 stays at the testing position.

After the substrate 11 is handed over to the conveying apparatus 15 at the handover position, the controller 18 causes the driving motor 53 to rotate the pair of belts 51 in synchronization with each other. As a result, the four profiles 54 move forward, and thereby the substrate 11 is sent forward. The four profiles 54 thus sent forward eventually come into contact with the restricting portions 72, so that the space between the facing profiles 54 of each pair of profiles 54 is narrowed down. In this manner, the left-right direction positioning of the substrate 11 placed on the four profiles 54 is performed. That is, the conveyance system 1 can convey the substrate 11 to a forward predetermined position while performing the positioning of the substrate 11.

Thus, the controller 18 controlling the operations of the respective apparatuses 13, 14, 15 and 16 is configured to control the operations of the lifting/lowering apparatus 13 and the handover apparatus 14 in the above-described manner, thereby passing the substrates 11 stored in the storage case 12 through the receiving position and the testing position one by one, and thus transfer each of the substrates 11 to the handover position. Meanwhile, the conveying apparatus 15 is configured such that the operation of the driving motor 53 is controlled by the controller 18, and thereby the substrates 11 transferred to the conveying apparatus 15 are placed onto four profiles 54 one by one.

Specifically, when a substrate 11 is placed onto four profiles 54, the controller 18 causes the driving motor 53 to move the pair of belts 51 forward by the predetermined pitch L. As a result, the four profiles 54 move forward by the predetermined pitch L, and thereby the substrate 11 is conveyed forward. Accordingly, next four profiles 54 are positioned to the four corners of the handover position, respectively. A next substrate 11 transferred by the handover apparatus 14 is handed over to the next four profiles 54, and the next substrate 11 is placed onto the placing area inside the next four profiles 54. Then, the controller 18 again causes the driving motor 53 to move the pair of belts 51 forward by the predetermined pitch L. By repeating these operations, substrates 11 can be continuously handed over to respective placing areas that are adjacent to each other. Accordingly, as shown in FIG. 1, substrates 11 can be placed on all of the placing areas positioned on the profiles 54 without missing any one of the placing areas.

Meanwhile, as described above, if it is determined at the testing position that a substrate 11 is a defective product, the defective substrate 11 is transferred from the testing position to the chute. Therefore, in this case, the aforementioned continuous handing over of the substrates 11 to the conveying apparatus 15 cannot be performed. In this case, the controller 18 refrains from rotating the pair of belts 51 to keep the current four profiles 54 at the handover position until it is determined next time at the testing position that a substrate 11 is not defective and the non-defective substrate 11 is transferred to the handover position. In this manner, even if a defective substrate 11 is removed by the transfer apparatus 16, a substrate 11 can be placed onto every one of the placing areas, which are arranged in the front-rear direction. This makes it possible to prevent a situation where a substrate 11 is not placed onto one of the placing areas and thereby the placement of the substrate 11 becomes partially missing from the arrangement of the plurality of substrates 11 between the pair of belts 51.

[Conveyance System for Storage]

Figure 10:
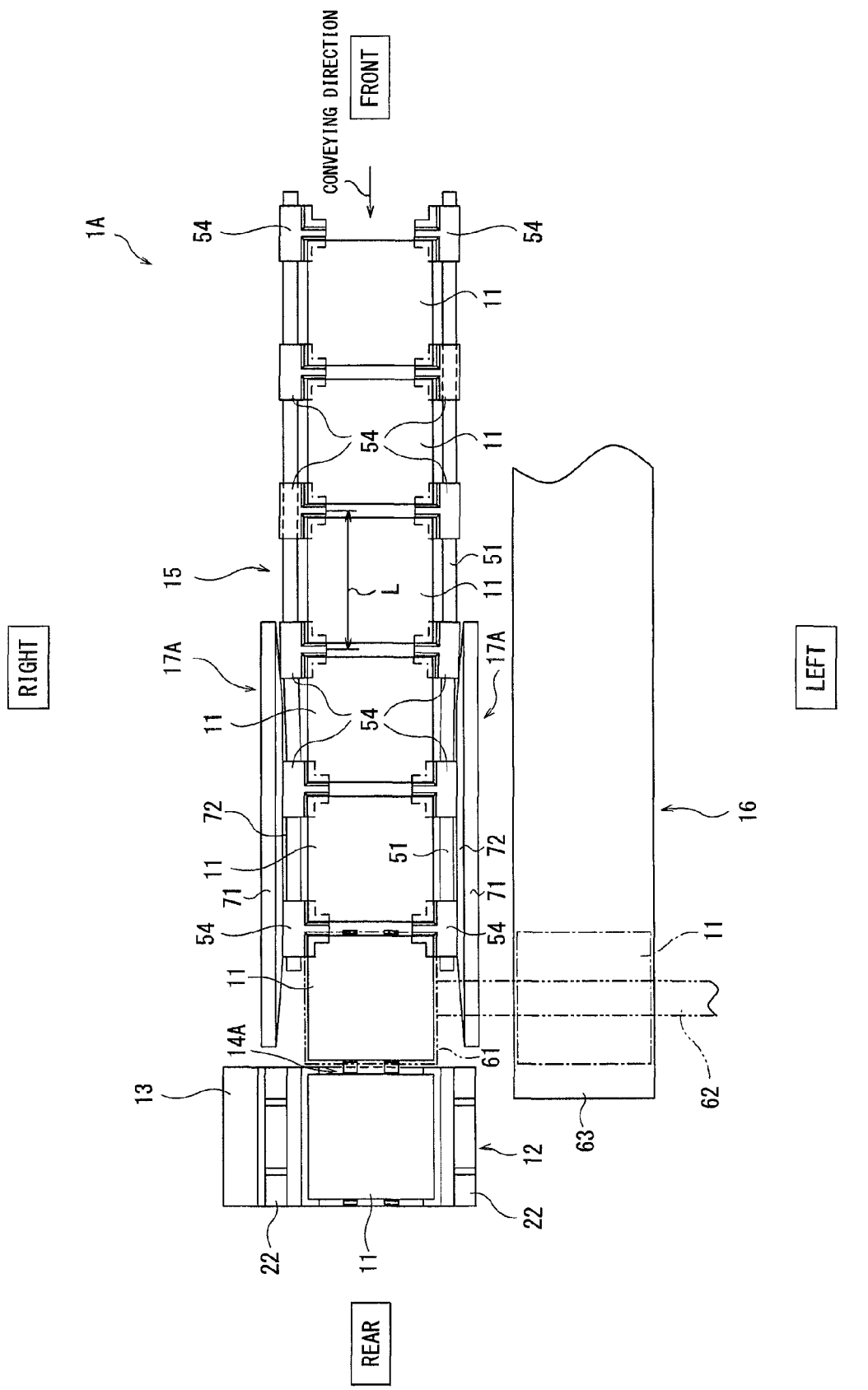
FIG. 10 is a plan view showing the configuration of a conveyance system for storage.

The conveyance system 1 with the above-described configuration can be used also for storing a substrate 11A, on which semiconducting processing has been performed, into the storage case 12. Hereinafter, such a conveyance system 1A for storage is described. Although the fundamental configuration of the conveyance system 1A is similar to that of the above-described conveyance system 1, the conveyance system 1A is different from the conveyance system 1 particularly in terms of the conveying direction, the arrangement positions of space-restricting mechanisms 17A, and the structure of a handover apparatus 14A, as shown in FIG. 10. It should be noted that, in FIG. 10, the controller 18 is not shown. The conveyance system 1A is configured such that a substrate 11A is placed onto four profiles 54 positioned at the front side of the conveyance system 1A, and the substrate 11A is conveyed rearward (i.e., toward the handover apparatus 14) by the conveying apparatus 15. In this manner, substrates 11A are conveyed to the handover position one by one.

In the conveyance system 1A, the space-restricting mechanisms 17A are positioned at the handover apparatus 14A side. At the handover apparatus 14A side, the space between the pair of belts 51 is narrowed down, so that the space between the profiles 54 of each pair of profiles 54 is narrowed down. This makes it possible to perform the left-right direction positioning of each substrate 11A while conveying the substrate 11A to the handover position.

Figure 11:
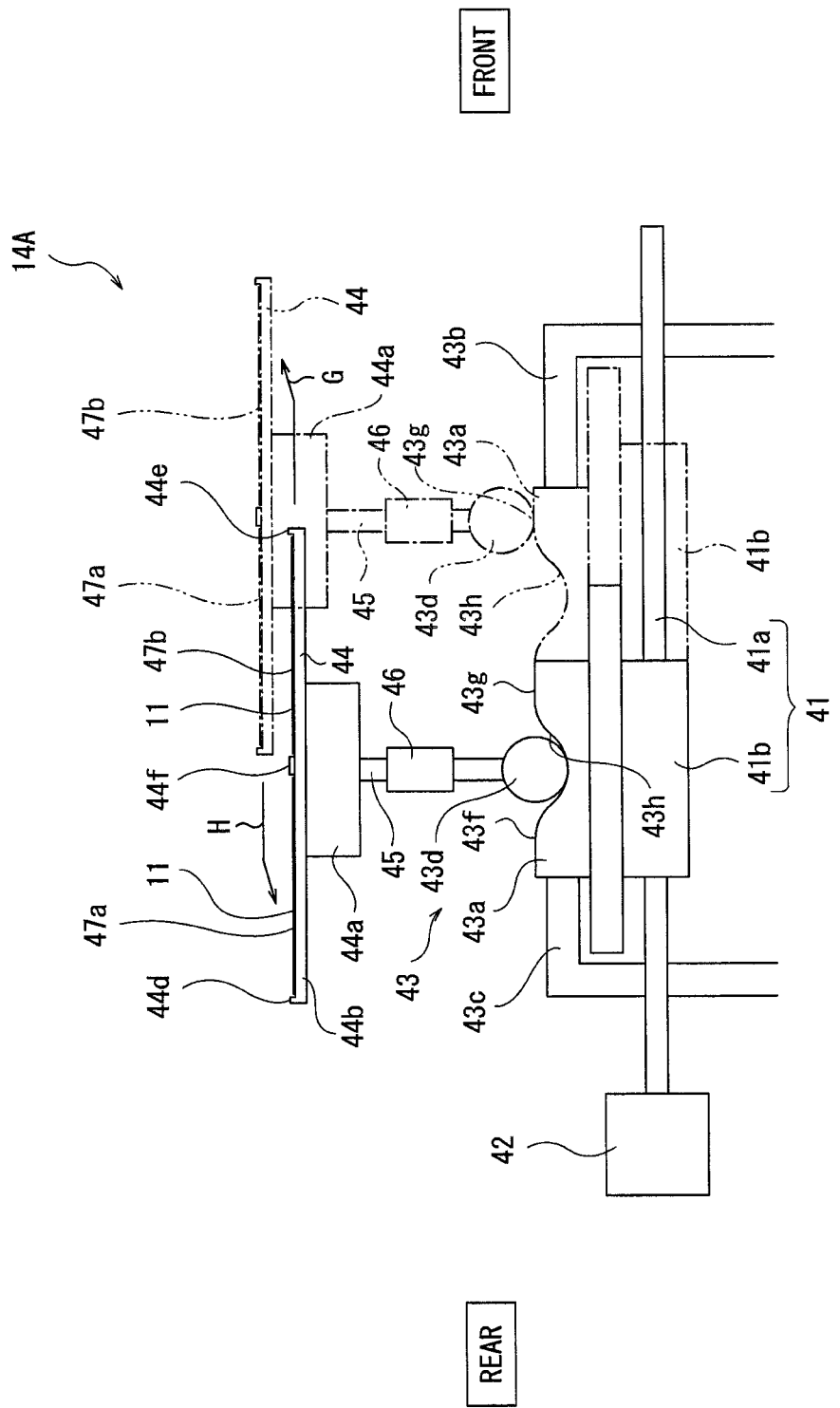
FIG. 11 is a side view showing the configuration of a handover apparatus included in the conveyance system of FIG. 10.

The handover apparatus 14A is configured to receive the substrate 11A at the handover position, and store the substrate 11A into the storage case 12 at the receiving position. To be specific, the handover apparatus 14A is configured such that when the slide member 41b further moves forward after the cam 43a has come into contact with the front-side stopper member as shown in FIG. 11, the cam follower 43d moves from the recess 43h of the cam 43a onto the front-side flat portion 43g. In this manner, owing to the forward movement of the slide member 41b, the front-side placing area 47b is lifted near the handover position and positioned to the receiving position (see an arrow G in FIG. 11). In this state, when the slide member 41b is moved rearward, the placing stand 44 moves horizontally at a higher elevation than the handover position, the testing position, and the receiving position, and then the cam 43a comes into contact with the rear-side stopper member. When the slide member 41b further moves rearward after the cam 43a has come into contact with the rear-side stopper member, the cam follower 43d moves from the front-side flat portion 43g down into the recess 43h. In this manner, owing to the rearward movement of the slide member 41b, the front-side placing area 47b is lowered near the testing position and positioned to the testing position (see an arrow H in FIG. 11).

<Storing Operation>

Next, operations of the conveyance system 1A for storing a substrate 11A into the storage case 12 are described. When a robot or the like, which is not shown, places a substrate 11A onto four profiles 54 positioned at the front side of the conveyance system 1A, the controller 18 causes the driving motor 53 to rotate the pair of belts 51. As a result, the four profiles 54 move toward the handover position while the space between the profiles 54 of each pair of profiles 54 is narrowed down, so that the positioning of the substrate 11A in the left-right direction is performed while the substrate 11A is being conveyed toward the handover position. Similar to the case of carrying out substrates, the controller 18 is configured to temporarily stop the profiles 54 each time the profiles 54 have moved by the predetermined pitch L. That is, the controller 18 stops driving the driving motor 53 each time a substrate 11A becomes positioned at the handover position. After stopping driving the driving motor 53, the controller 18 moves the slide member 41b of the handover apparatus 14A forward, thereby moving the front-side placing area 47b of the placing stand 44 to the handover position. As a result, the substrate 11A at the handover position is placed onto the front-side placing area 47b, and the handover apparatus 14 receives the substrate 11A from the conveying apparatus 15. At the time, if a substrate 11A is present at the testing position, the substrate 11A is placed onto the rear-side placing area 47a.

After the substrate 11A at the handover position is placed onto the front-side placing area 47b, the controller 18 moves the slide member 41b rearward, thereby moving the front-side placing area 47b to the testing position. Near the testing position, the front-side placing area 47b moves toward the testing position while being lowered. Accordingly, when the front-side placing area 47b reaches the testing position, the substrate 11A on the front-side placing area 47b is placed, and thus handed over, onto the pair of supports 48.

While the front-side placing area 47b is moving to the testing position, the rear-side placing area 47a moves to the receiving position. Near the receiving position, similar to the front-side placing area 47b, the rear-side placing area 47a moves toward the receiving position while being lowered. Accordingly, when the rear-side placing area 47a reaches the receiving position, the left-side and right-side edges of the substrate 11 on the rear-side placing area 47a are placed onto a pair of support plates 23 disposed at the left side and the right side of the receiving position. After the left-side and right-side edges of the substrate 11 are placed onto the pair of support plates 23, the rear-side placing area 47a is further lowered, and the substrate 11A is received by the pair of support plates 23. After the substrate 11A is received by the pair of support plates 23, the controller 18 causes the lifting/lowering apparatus 13 to lift the storage case 12, thereby moving a next pair of support plates 23 positioned below the pair of support plates 23 having received the substrate 11A to the receiving position. By repeating these operations, substrates 11 placed on the conveying apparatus 15 can be properly and readily stored into the storage case 12 one after another.

It should be noted that, at the testing position, the testing device which is not shown performs a test to check whether there is any defect in the processing performed on the substrate 11A. If there is a defect, the controller 18 drives the transfer apparatus 16 to remove the defective substrate 11A from the conveying path. In the case where the substrate 11A has been thus removed, since there is no substrate 11A to move from the testing position to the receiving position, the controller 18 refrains from driving the lifting/lowering apparatus 13 and causes the storage case 12 to stand by even if the rear-side placing area 47a has reached the receiving position after the test. This makes it possible to cause all the vertically arranged pairs of support plates 23 to support respective substrates 11, and thus store the substrates in the storage case 12.

Other Embodiments

The conveyance system 1 according to the present embodiment realizes vertical movement of the placing stand 44 by means of the cam mechanism 43. However, the vertical movement may be realized by means of another driving mechanism different from the driving mechanism 42. The space-restricting mechanisms 17 are disposed at both sides of the pair of belts 51, respectively. However, as an alternative, the space-restricting mechanism 17 may be provided at the outside of only one of the belts 51. Although the space-restricting mechanisms 17 are configured to restrict the space between the pair of belts 51 in an indirect manner by means of profiles 54, the space-restricting mechanisms 17 may alternatively be configured to restrict the space between the pair of belts 51 by directly pushing the belts 51. Although the space-restricting mechanisms 17 are configured to restrict the space between the pair of belts 51 by narrowing down the space, the space-restricting mechanisms 17 may alternatively be configured to restrict the space between the pair of belts 51 by widening the space at the handover position.

From the foregoing description, numerous modifications and other embodiments of the present invention are obvious to one skilled in the art. Therefore, the foregoing description should be interpreted only as an example and is provided for the purpose of teaching the best mode for carrying out the present invention to one skilled in the art. The structural and/or functional details may be substantially altered without departing from the spirit of the present invention.

REFERENCE SIGNS LIST 1, 1A conveyance system
11, 11A substrate
12 storage case
13 lifting/lowering apparatus
14, 14A handover apparatus
15 conveying apparatus
16 transfer apparatus
17, 17A space-restricting mechanism
18 controller
42 driving mechanism
43 cam mechanism
44 placing stand
47a rear-side placing area
47b front-side placing area
51 belt
53 driving motor
54 profile
54a base portion

The invention claimed is:

1. A conveyance system comprising:
a storage case configured to store a plurality of substrates such that the stored substrates are vertically spaced apart from each other;
a lifting/lowering apparatus configured to lift and lower the storage case to position each substrate stored in the storage case to a receiving position sequentially;
a handover apparatus configured to receive the substrate at the receiving position, and hand over the substrate at a handover position; and
a conveying apparatus configured to receive the substrate at the handover position, and convey the substrate, wherein the conveying apparatus includes:
a plurality of conveying belts each extending in a conveying direction and provided such that the conveying belts are arranged side by side and spaced apart from each other in a predetermined direction;
a plurality of support members associated with each other and provided on the plurality of conveying belts, respectively; and
a conveying unit configured to drive the plurality of conveying belts such that the plurality of support members associated with each other move together in the conveying direction, and
the support members, which are associated with each other and which are provided on the plurality of conveying belts, include support areas supporting the substrate and tapered surfaces contacted by the received substrate, the tapered surfaces being tapered downward toward the support areas, and the support members are configured to guide, by the tapered surfaces, the substrate that has been handed over at the handover position to prescribed positions on the support areas, and support outer edges of the substrate at the prescribed positions on the support areas.

2. The conveyance system according to claim 1, wherein the handover apparatus includes:
a placing stand on which the substrate is to be placed;
a moving unit configured to move the placing stand between the receiving position and the handover position; and
a lifting/lowering cam mechanism configured to lift and lower the placing stand in conjunction with movement of the placing stand, and
the lifting/lowering cam mechanism is configured to:
when the placing stand is moved to the receiving position, lift the placing stand to receive the substrate on the placing stand; and
when the placing stand is moved to the handover position, lower the placing stand to hand over the substrate to the plurality of support members.

3. The conveyance system according to claim 2, comprising:
a transfer apparatus provided at a middle position between the receiving position and the handover position and configured to transfer, when the substrate is at the middle position, the substrate in a direction different from the conveying direction in accordance with a condition of the substrate; and
a controller configured to control operations of the conveying unit and the transfer apparatus, wherein
the placing stand includes a first area and a second area, on each of which the substrate is to be placed,
the first area is configured such that, when the placing stand is moved to the receiving position, the first area receives the substrate at the receiving position, and when the placing stand is moved to the handover position, the first area positions the substrate that is placed on the first area to the middle position,
the second area is configured such that, when the placing stand is moved to the receiving position, the second area receives the substrate that is positioned at the middle position, and when the placing stand is moved to the handover position, the second area hands over the substrate that is placed on the second area to the plurality of support members, which are associated with each other,
multiple sets of the plurality of support members associated with each other are installed on the conveying belts and arranged in the conveying direction, and
the controller is configured to:
cause the conveying unit to move the conveying belts forward by a length of the substrate in the conveying direction after the handover apparatus is positioned to the handover position; and
refrain from causing the conveying unit to move the conveying belts forward after the handover apparatus is positioned to the handover position if the substrate has been transferred by the transfer apparatus.

4. A conveyance system, comprising:
a storage case configured to store a plurality of substrates such that the stored substrates are vertically spaced apart from each other;

a lifting/lowering apparatus configured to lift and lower the storage case to position each substrate stored in the storage case to a receiving position sequentially;

a handover apparatus configured to receive the substrate at the receiving position, and hand over the substrate at a handover position; and a conveying apparatus configured to receive the substrate at the handover position, and convey the substrate, and a space-restricting mechanism configured to restrict space between a pair of conveying belts in a predetermined direction among a plurality of conveying belts, wherein the conveying apparatus includes:

the plurality of conveying belts each extending in a conveying direction and provided such that the conveying belts are arranged side by side and spaced apart from each other in the predetermined direction;

a plurality of support members associated with each other and provided on the plurality of conveying belts, respectively; and a conveying unit configured to drive the plurality of conveying belts such that the plurality of support members associated with each other move together in the conveying direction, and the support members, which are associated with each other and which are provided on the plurality of conveying belts, are configured to support outer edges of the substrate that has been handed over at the handover position, and position the supported substrate to a prescribed position on the support members, the support members that are associated with each other and that are provided on the pair of conveying belts, respectively, include:

support portions configured to support respective outer edges of the substrate at both sides of the substrate in the predetermined direction; and positioning portions configured to position respective side surfaces of the substrate in the predetermined direction, the positioning portions facing each other in the predetermined direction, and the support members are configured such that, in a state where the space-restricting mechanism is not narrowing down the space between the pair of conveying belts in the predetermined direction, the support members associated with each other and provided on the pair of conveying members support the outer edges of the substrate that has been handed over at the handover position, and when the space-restricting mechanism narrows down the space between the pair of conveying belts in the predetermined direction, the support members position the supported substrate to the prescribed position.

5. The conveyance system according to claim 4, wherein the handover apparatus includes:

a placing stand on which the substrate is to be placed;

a moving unit configured to move the placing stand between the receiving position and the handover position; and a lifting/lowering cam mechanism configured to lift and lower the placing stand in conjunction with movement of the placing stand, and the lifting/lowering cam mechanism is configured to:

when the placing stand is moved to the receiving position, lift the placing stand to receive the substrate on the placing stand; and when the placing stand is moved to the handover position, lower the placing stand to hand over the substrate to the plurality of support members.

6. The conveyance system according to claim 5, comprising:

a transfer apparatus provided at a middle position between the receiving position and the handover position and configured to transfer, when the substrate is at the middle position, the substrate in a direction different from the conveying direction in accordance with a condition of the substrate; and a controller configured to control operations of the conveying unit and the transfer apparatus, wherein the placing stand includes a first area and a second area, on each of which the substrate is to be placed, the first area is configured such that, when the placing stand is moved to the receiving position, the first area receives the substrate at the receiving position, and when the placing stand is moved to the handover position, the first area positions the substrate that is placed on the first area to the middle position, the second area is configured such that, when the placing stand is moved to the receiving position, the second area receives the substrate that is positioned at the middle position, and when the placing stand is moved to the handover position, the second area hands over the substrate that is placed on the second area to the plurality of support members, which are associated with each other, multiple sets of the plurality of support members associated with each other are installed on the conveying belts and arranged in the conveying direction, and the controller is configured to:

cause the conveying unit to move the conveying belts forward by a length of the substrate in the conveying direction after the handover apparatus is positioned to the handover position; and refrain from causing the conveying unit to move the conveying belts forward after the handover apparatus is positioned to the handover position if the substrate has been transferred by the transfer apparatus.

7. A conveyance system comprising:

a conveying apparatus configured to convey a received substrate to the receiving position;

a handover apparatus configured to receive the substrate at the receiving position from the conveying apparatus, and hand over the substrate at a handover position;

a storage case including storage spaces each storing the substrate handed over by the handover apparatus, the storage spaces being positioned such that the storage spaces are vertically spaced apart from each other; and a lifting/lowering apparatus configured to lift and lower the storage case to position each storage space of the storage case to the receiving position sequentially, wherein the conveying apparatus includes:

a plurality of conveying belts each extending in a conveying direction and provided such that the conveying belts are arranged side by side and spaced apart from each other in a predetermined direction;

a plurality of support members associated with each other and provided on the plurality of conveying belts, respectively; and a conveying unit configured to drive the plurality of conveying belts such that the plurality of support members associated with each other move together in the conveying direction, and the support members, which are associated with each other and which are provided on the plurality of conveying belts, include support areas supporting the substrate and tapered surfaces contacted by the received substrate, the tapered surfaces being tapered downward toward the support areas, and the support members are configured to guide, by the tapered surfaces, the received substrate to prescribed positions on the support areas, and support outer edges of the substrate at the prescribed positions on the support areas.

* * * * *